United States Patent
Petranovic et al.

(10) Patent No.: US 6,546,541 B1
(45) Date of Patent: Apr. 8, 2003

(54) PLACEMENT-BASED INTEGRATED CIRCUIT RE-SYNTHESIS TOOL USING ESTIMATED MAXIMUM INTERCONNECT CAPACITANCES

(75) Inventors: Dusan Petranovic, Cupertino, CA (US); Ivan Pavisic, San Jose, CA (US); Aiguo Lu, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 104 days.

(21) Appl. No.: 09/789,108

(22) Filed: Feb. 20, 2001

(51) Int. Cl.[7] .............................. G06F 17/50; G06F 9/45
(52) U.S. Cl. .................. 716/18; 716/2; 716/9; 716/10
(58) Field of Search .................. 716/18, 1–17, 716/19–21

(56) References Cited

U.S. PATENT DOCUMENTS

| | | | | |
|---|---|---|---|---|
| 5,402,357 A | * | 3/1995 | Schaefer et al. | 716/12 |
| 5,687,088 A | * | 11/1997 | Tomita | 703/15 |
| 5,913,101 A | * | 6/1999 | Murofushi et al. | 438/6 |
| 5,914,887 A | | 6/1999 | Scepanovic et al. | |
| 5,956,497 A | * | 9/1999 | Ratzel et al. | 716/1 |
| 6,009,531 A | * | 12/1999 | Selvidge et al. | 713/400 |
| 6,080,201 A | * | 6/2000 | Hojat et al. | 703/14 |
| 6,099,584 A | * | 8/2000 | Arnold et al. | 716/19 |
| 6,205,572 B1 | * | 3/2001 | Dupenloup | 716/5 |
| 6,249,902 B1 | * | 6/2001 | Igusa et al. | 716/10 |
| 6,317,861 B1 | * | 11/2001 | Hasegawa | 716/6 |
| 6,324,671 B1 | * | 11/2001 | Ratzel et al. | 716/1 |
| 6,421,818 B1 | * | 7/2002 | Dupenloup et al. | 716/18 |

OTHER PUBLICATIONS

A. Ginetti et al., Modifying the Netlist After Placement for Performance Improvement, IEEE Proceedings of the 1993 Custom Integrated Circuits Conference, p. 9.2.1–9.2.4, Mar. 1993.*

A. Lu et al., Combining Technology Mapping with Post–placement Resynthesis for Performance Optimization, International COnfernece on Computer Design: VLSI in Computers and Processors, pp. 616–621, Oct. 1998.*

T. Sakurai, "Approximation of Wiring Delay in MOSFETT LSI", IEEE Journal of Solid–State Circuits, vol. SC–18, No. 4, Aug. 1983.

L. Pillage and R. Rohrer, "Asymptotic Waveform Evaluation for Timing Analysis", IEEE Trans. On Computer–Aided Design, pp 352–366, Apr. 1990.

* cited by examiner

Primary Examiner—Matthew Smith
Assistant Examiner—A. M. Thompson
(74) Attorney, Agent, or Firm—Westman, Champlin & Kelly

(57) ABSTRACT

A method and apparatus are provided for generating constraints for an integrated circuit logic re-synthesis algorithm. The method and apparatus receive a netlist of interconnected logic elements, which includes a plurality of nets, wherein each of the nets is coupled between a respective net driver logic element and at least one driven logic element. The method and apparatus also receive a maximum allowable input ramp time specification for the logic elements and an output ramp time specification for the net driver logic elements. A maximum interconnect capacitance constraint is then generated for each of the net driver logic elements based on the output ramp time specification for that net driver logic element and the maximum allowable input ramp time specification.

20 Claims, 3 Drawing Sheets

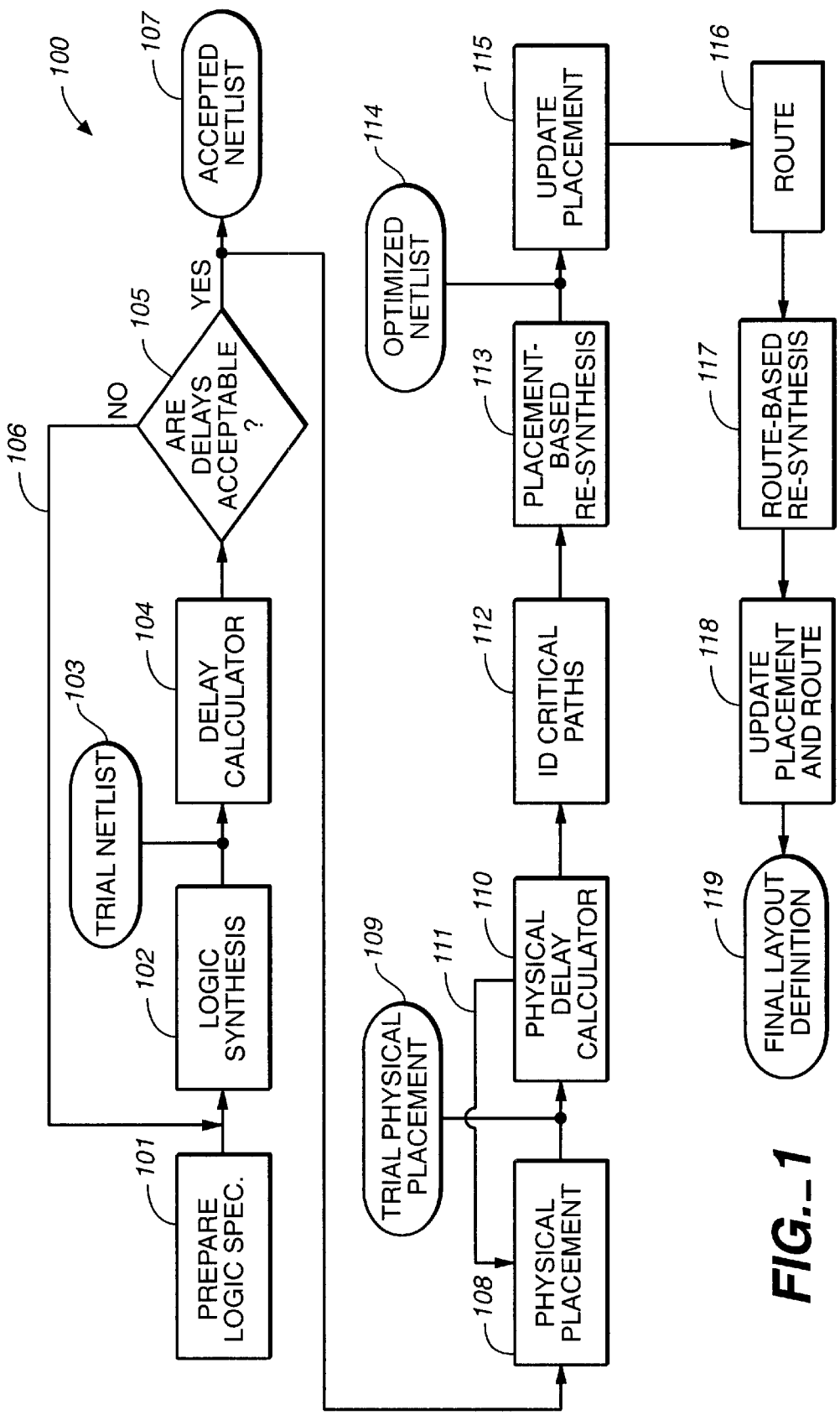
FIG._1

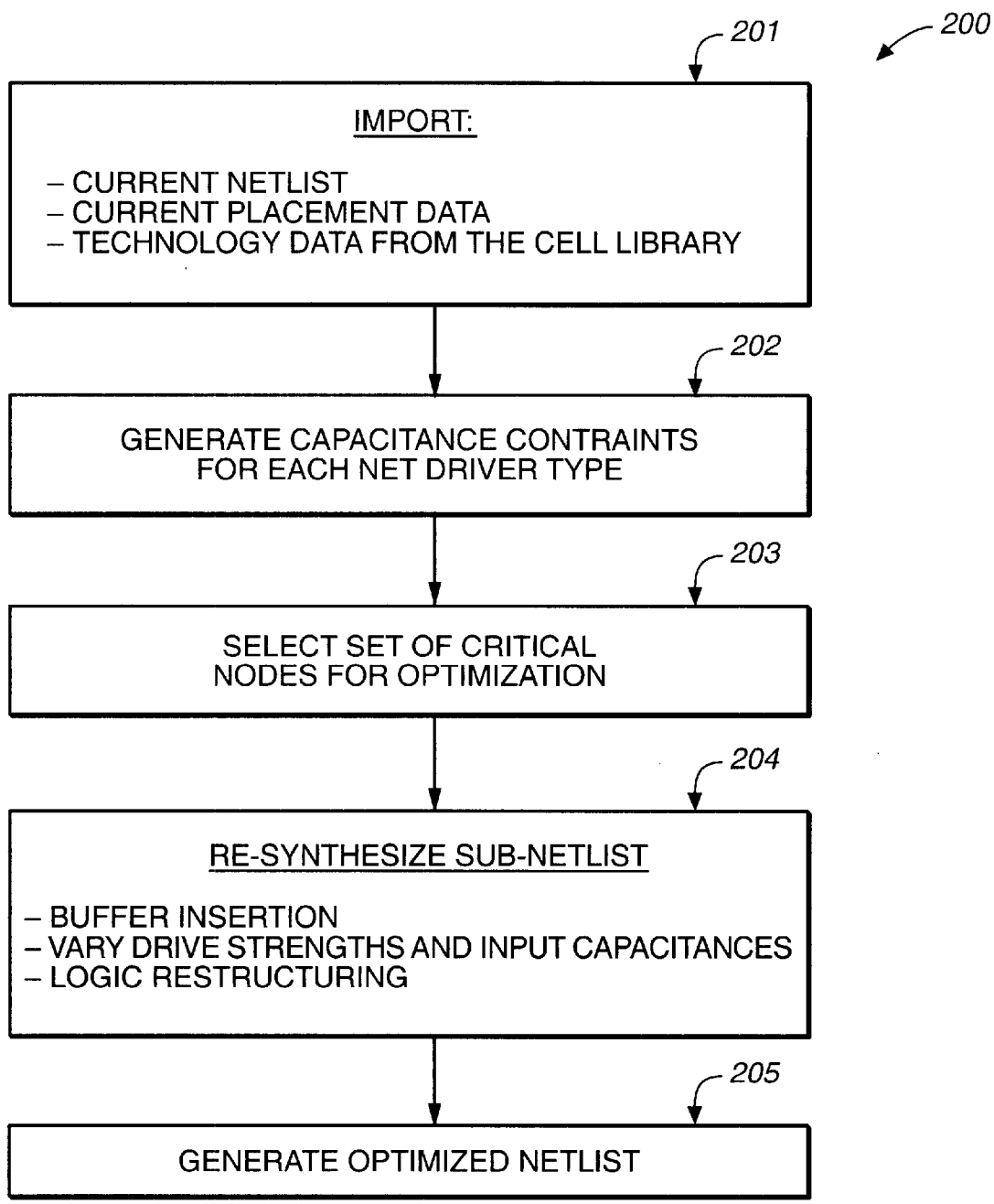
FIG._2

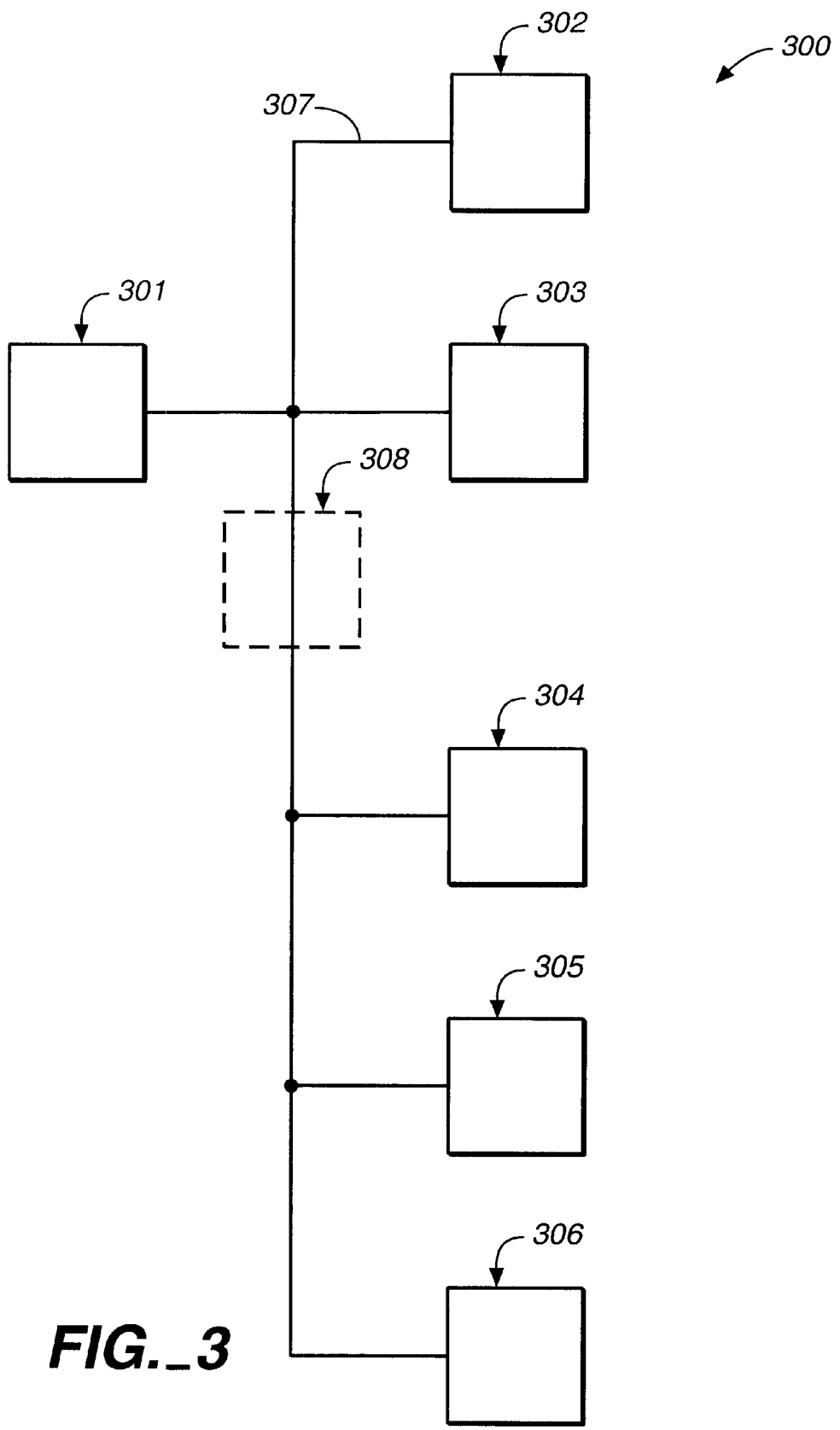
FIG._3

PLACEMENT-BASED INTEGRATED CIRCUIT RE-SYNTHESIS TOOL USING ESTIMATED MAXIMUM INTERCONNECT CAPACITANCES

BACKGROUND OF THE INVENTION

The present invention relates to the design of semiconductor integrated circuits, and more specifically to reduction of ramp time violations during a placement-based re-synthesis procedure, prior to routing.

Semiconductor integrated circuits are traditionally designed and fabricated by first preparing a schematic diagram or hardware description language (HDL) specification of a logical circuit in which functional elements are interconnected to perform a particular logical function. With standard cell technology, the schematic diagram or HDL specification is synthesized into standard cells of a specific cell library or into generic cells that are later re-synthesized into cells of a specific cell library.

Each cell corresponds to a logical function unit, which is implemented by one or more transistors that are optimized for the cell. The logic designer selects the cells according to the number of loads that are attached to the cell, as well as an estimated interconnection required for routing. The cells in the cell library are defined by cell library definitions. Each cell library definition includes cell layout definitions and cell characteristics. The cell layout definition includes a layout pattern of the transistors in the cell, geometry data for the cell's transistors and cell routing data. The cell characteristics include, for example, a cell propagation delay, a model of the cell's function, input capacitance, output capacitance and output ramp time as a function of load.

A series of computer-aided design tools generate a netlist from the schematic diagram or HDL specification of the selected cells and the interconnections between the cells. The netlist is used by a floor planner or placement tool to place the selected cells at particular locations in an integrated circuit layout pattern. The interconnections between the cells are then routed along predetermined routing layers. The design tools then determine the output loading of each cell as a function of the number of loads attached to each cell, the placement of each cell and the routed interconnections.

A timing analysis tool is then used to identify timing violations within the circuit. The time it takes for a signal to travel along a particular path or "net" from one sequential element to another depends on the number of cells in the path, the internal cell delay, the number of loads attached to the cells in the path, the length of the routed interconnections in the path and the drive strengths of the transistors in the path. Once any timing violations have been corrected, the netlist, the cell layout definitions, the placement data and the routing data together form an integrated circuit layout definition, which can be used to fabricate the integrated circuit.

In a traditional iterative design process, timing violations are eliminated by making adjustments at each stage in the layout process. For example, an under-driven cell may be fixed by changing the logic diagram or logic synthesis tool to insert a cell having a larger drive strength. Alternatively, the logic diagram can be changed to divide the loads between one or more redundant cells or buffer cells. An exceptionally long routing path can be corrected by adjusting the routing path itself and/or the placement of cells in the path.

Until recently, there has been little interaction between the various computer-aided design tools because the above steps were well-defined and there was not a great need for interaction. However, the current movement toward the use of deep-sub-micron technology will fundamentally alter this methodology, and increased interaction between logic synthesis and layout is becoming necessary. For example, placement-driven synthesis uses information available after placement to make decisions about logic transformations. These logic transformations can include the re-synthesis of generic cells into cells of a specific technology library or when optimizing areas of the logic design that contain large, multi-input functional blocks, such as large AND, OR and XOR blocks and large buffer trees having multiple "fanouts". These blocks can be implemented with a variety of circuit configurations. The placement information is used to achieve timing closure during these logic transformations, which can avoid numerous time consuming iterations.

However, prior to routing, there is little timing information on which to base these timing closure decisions. These decisions are based on only rough timing estimates of the delay through each logical function and typical routing path lengths. This is particularly true when the logic design is being synthesized into generic cells, as opposed to cells of a particular cell library or technology. In the typical approach, the initial placement is not timing driven since little or no timing information is available at this stage in the fabrication process.

For example, the logic transformation decisions during re-synthesis do not take into account ramp time violations. The ramp time of a signal is the time it takes a device to drive a net from a logic low state to a logic high state. Each technology has a specified maximum allowable ramp time that can occur at the input of a cell. As a particular signal propagates through the interconnected cells, degradation of ramp times along the interconnect causes the signal waveform to change shape. This change in waveform shape not only increases critical path delay, but also makes it difficult to estimate ramp times at the inputs of the driven cells. These ramp time estimates are important factors in calculating delays of the next stages and consequently, in calculating critical path delay and clock frequency. In addition, waveform deformation can be so extensive as to exceed the maximum allowable ramp time at the input of a cell, which causes a ramp time violation. This is particularly true with deep sub-micron technology. All such violation must be eliminated prior to finalizing the integrated circuit layout definition used for fabrication.

Once routing information is available, it is possible to precisely calculate the waveform shape at the inputs of the driven cells and to find ramp time degradations and violations. For example, L. Pillage and R. Rohrer, "Asymptotic Waveform Evaluation for Timing Analysis", IEEE Trans. on Computer-Aided Design, 352–366, (April 1990) describe an algorithm commonly used for that purpose. It would, however, be of great benefit to be able to estimate and eliminate ramp time violations early in the design process because the lower level design processes tools such as routing have not been capable of changing the netlist structure and have limited options for violation elimination. Unfortunately, there are several obstacles to estimating and eliminating ramp time violations prior to routing. These obstacles include unavailability of exact wire lengths and interconnect topology, inaccurate interconnect models and ramp time estimations used in synthesis and placement, and unavailability of an efficient algorithm to eliminate ramp time violations based on available information. Most existing design tools cannot handle these problems.

Thus, improved techniques are desired for estimating an eliminating ramp time violations earlier in the design process, such as during placement-based logic resynthesis.

SUMMARY OF THE INVENTION

One aspect of the present invention relates to a method of generating constraints for an integrated circuit logic re-synthesis algorithm. According to the method, a netlist of interconnected logic elements is received, which includes a plurality of nets, wherein each of the nets is coupled between a respective net driver logic element and at least one driven logic element. Also received are a maximum allowable input ramp time specification for the logic elements and an output ramp time specification for the net driver logic elements. A maximum interconnect capacitance constraint is then generated for each of the net driver logic elements based on the output ramp time specification for that net driver logic element and the maximum allowable input ramp time specification.

Another aspect of the present invention is directed to a computer-readable medium having instructions readable by a computer-aided design tool for optimizing a functional block within a netlist of an integrated circuit. The instructions, when executed, cause the tool to perform steps, including (a) inputting the netlist, wherein the netlist comprises interconnected logic elements, including a plurality of nets, wherein each of the nets is coupled between a respective net driver logic element and at least one driven logic element; (b) inputting a maximum allowable input ramp time specification for the logic elements and an output ramp time specification for the net driver logic elements; and (c) generating a maximum interconnect capacitance constraint for each of the net driver logic elements based on the output ramp time specification for that net driver logic element and the maximum allowable input ramp time specification.

Another aspect of the present invention is directed to a computer-aided design tool for optimizing a functional block within a netlist of interconnected logic elements, which includes a plurality of nets. Each of the nets is coupled between a respective net driver logic element and at least one driven logic element. The design tool receives the netlist, a maximum allowable input ramp time specification for the logic elements, and an output ramp time specification for the net driver logic elements. The design tool then generates a maximum interconnect capacitance constraint for each of the net driver logic elements based on the output ramp time specification for that net driver logic element and the maximum allowable input ramp time specification.

BRIEF DESCRIPTION OF THE DRAWINGS

FIG. 1 is a flowchart of a layout process in which placement-based ramp time constraints can be used, according to one embodiment of the present invention.

FIG. 2 is a flowchart of a re-synthesis algorithm used in the layout process shown in FIG. 1, according to one embodiment of the present invention.

FIG. 3 is a schematic illustrating optimization of a critical net in an integrated circuit logic diagram.

DETAILED DESCRIPTION OF ILLUSTRATIVE EMBODIMENTS

The present invention is directed to a ramp time optimization procedure which allows reduction or elimination of ramp time violations during placement-based logic re-synthesis. Each technology has a specification that sets the maximum allowable ramp time that can occur at an input pin without causing a ramp time violation. Ramp time violations are reduced by generating a capacitance constraint for each net driver type in the technology library and providing the constraints to the re-synthesis algorithm. The capacitance constraints estimate for each net in the netlist the total interconnect capacitance, including wire capacitance and pin capacitance that would result in the maximum allowable ramp time at the input pins coupled to that net. The capacitance constraints are used by the re-synthesis algorithm to ensure that each net has a capacitance that is smaller than the capacitance constraint of the net driver. With these constraints, the degraded ramp times at each input pin are smaller than the maximum allowable ramp time value.

FIG. 1 is a flow chart of a layout process 100 in which one embodiment of the present invention is useful. The first step in layout process 100 is to prepare a schematic diagram or HDL specification, at 101, in which functional elements are interconnected to perform a particular logical function. At step 102, the schematic diagram or HDL specification is synthesized into cells of a cell library through a technology mapping program. In one embodiment, the diagram is synthesized into a generic cell library that can be mapped into a specific cell library for a particular manufacturer or technology in subsequent process steps. In another embodiment, the diagram is synthesized directly into cells of a specific cell library.

The technology mapping program used in step 102 generates a trial netlist 103 of the selected cells and the interconnections between the cells. These interconnections are called "nets". Each net is driven by a net driver logic element (or cell) and is coupled to the inputs of one or more driven logic elements (or cells).

Each cell in the library has an associated cell definition having physical data and timing characteristics associated with that cell. The cell definition can include, for example, an analytical delay model, which estimates typical cell propagation delays, a model of the cell's function, and a cell layout definition. The cell layout definition includes an estimated layout pattern of the transistors in the cell, estimated geometry data for the cell's transistors and estimated cell routing data.

For each basic cell type, the technology library provides a table of delay as a function of output load, a table of output ramp time values as a function of output load, as well as a table of input capacitances. This information is used to arrive at generalized parameters so that fairly accurate delay models can be obtained for trial netlist 103. The estimated delay along a particular path depends on a sum of the cell delays in that path, the "fan-in" count of each input pin and the "fan-out" count of each output pin.

Based on the current trial netlist 103 and the delay models for the cells in the netlist, a delay calculator calculates delays along each path in the netlist, at step 104. Since trial netlist 103 has not yet been placed or routed, delay calculator 104 is not capable of taking into account the actual physical position of each cell and the interconnection wire lengths. The delays that are calculated at step 104 are tested at decision point 105 to determine if all delays are acceptable. If one or more delays are found not acceptable, layout process 100 returns along line 106 to generate another trial netlist 103 through the technology mapping program, at step 102. Once the delays for all of the nets in the current trial netlist 103 are found to be acceptable at decision point 105, then program flow continues along line 106 with an accepted netlist 107.

At step 108, the cells in accepted netlist 107 are placed by arranging the cells in particular locations to form a trial physical placement pattern 109 for the integrated circuit. At step 110, a more accurate physical delay calculator is used, which takes into account the placement of each cell and an estimate of typical routing lengths for the interconnections between the cells. For example, a bounding box can be used, which estimates the wire lengths based on the smallest rectangle that encloses all pins on a particular net. For a two-pin net, the wire length can be estimated as approximately one-half of the perimeter of the smallest rectangle that encloses both pins. The physical placement at step 108, can be iteratively repeated as shown by arrow 111 until all delays have sufficiently converged.

The delay calculations made at step 110 are used to identify critical paths with excessive delays. Any remaining critical paths that have not converged are identified at step 112. A list of these critical paths is provided to a placement-based re-synthesis algorithm, at step 113.

The re-synthesis algorithm optimizes portions of the current trial netlist 103 in an attempt to reduce or eliminate the critical paths. The algorithm uses the placement data generated at step 108, the delay calculations performed at step 110 and additional capacitance constraints that are generated for each net driver. With these input parameters, the re-synthesis algorithm performs a timing-driven re-synthesis in which the netlist can be optimized in several ways. For example, buffers or buffer trees can be inserted in particularly long nets or nets having a large fan-out. Also, selected net drivers can be replaced with cells having a higher drive strength and selected net receivers can be replaced with cells having lower input capacitances. In addition, certain portions of the netlist can be re-structured to further improve timing. This can be done by manipulating the Boolean functions of critical nodes such that their critical fan-ins have less delay. Examples of such logic re-synthesis are described in U.S. patent application Ser. No. 09/678,478, filed Oct. 2, 2000, and entitled "Method and Apparatus for Dynamic Buffer and Inverter Tree Optimization" and in U.S. patent application Ser. No. 09/677,475, filed Oct. 2, 2000, and entitled "Method and Apparatus for Timing Driven Resynthesis," which are assigned to the same assignee as the present application and are hereby incorporated by reference.

The same type of delay calculator is used by the re-synthesis algorithm as is used during physical placement. One example of the delay calculations that can be made in the re-synthesis algorithm at step 113 is described in Aiguo Lu et al., "Combining Technology Mapping with Post-Placement Resynthesis for Performance Optimization," pp. 616–621, ICCD'98 (October 1998), which estimates the interconnect delay based on the fan-out count of a subject graph of the netlist. The subject graph essentially graphs the fan-outs at each node in the netlist being optimized. Other types of delay calculations can also be used.

During the re-synthesis process, the re-synthesis algorithm reduces or eliminates ramp time violations prior to routing by taking into account ramp time constraints on each net. Since exact wire lengths are not yet available at step 113, exact ramp time calculations cannot be performed. Rather, the re-synthesis algorithm uses an estimated maximum allowable capacitance for each net that does not cause a ramp time violation, as a metric for ramp time control.

During initialization of the re-synthesis algorithm, the algorithm imports the current netlist, the physical placement data and technology data from the cell library. This technology data includes a maximum allowable input ramp time for the technology, input capacitances for each cell, tables of output ramp times as a function of output load for each net driver type, and interconnect unit resistance and capacitance constants for the technology. Based on these input parameters, the re-synthesis algorithm generates capacitance constraints for each net driver type. These capacitance constraints represent the maximum total interconnect capacitance that can be driven by that net driver type without causing a ramp time violation at the inputs of the driven cells.

The ramp time of a signal is the time it takes a net driver device to drive a net from a logic low state to a logic high state. Each technology has a specified maximum allowable ramp time that can occur at the input of a cell. As the particular signal propagates through the interconnected cells, degradation of ramp times along the interconnect causes the signal waveform to change shape. If the waveform deformation is so extensive as to exceed the maximum allowable ramp time at the input of a cell, a ramp time violation occurs.

Once routing information is available, it is possible to precisely calculate the waveform shape at the inputs of the driven cells and to find ramp time degradations and violations. However, such routing data is not yet available at this stage in layout process 100. Therefore, estimates for ramp time degradations must be used. A fairly accurate estimate of the interconnect delay for two-pin nets can be calculated by the well-known Sakurai formula, assuming a step input to the net:

$$\Delta_{0.9} = 1.02 C_w R_w + 2.21 (R_d C_L + R_w C_L + R_d C_w) \qquad \text{Eq. 1}$$

where $R_d$ is the net driver's resistance, $C_L$ is the load capacitance and $R_w$ and $C_w$ are the interconnect wire resistance and capacitance, respectively. T. Sakurai, "Approximation of Wiring Delay in MOSFET LSI," IEEE Journal of Solid State Circuits, Vol. SC-18, No. 4 (August 1983). The relative error of Equation 1 is reported to be less than 4% for the entire range of parameters.

However, the use of Equation 1 for re-synthesis in step 113 is not appropriate for several reasons. First, Equation 1 is derived for estimating interconnect delay for two-pin nets. In contrast, the re-synthesis algorithm would preferably have the capability of estimating interconnect delays and thus ramp times for designs having a variety of multiple-pin nets. Also, precise estimation of the ramp time degradation is not necessary during step 113. At placement level, no routing information is available. Therefore, using a precise formula with rough wire length estimates would not make much sense.

Instead, the re-synthesis algorithm at step 113 uses the worst case ramp time degradation (i.e. the ramp time degradation at which a violation occurs) for each net in the netlist to find a corresponding equivalent net capacitance that causes such a violation.

Taking into account the above-factors, the following equation estimates a worst case ramp time degradation on a particular net:

$$T_{Rdeg}(C_{TOT}) = \alpha R_w \left( C_w + \sum_{i=1}^{q} -C_i \right) + \beta T_{Rdr}(C_{TOT}) \qquad \text{Eq. 2}$$

where $T_{Rdeg}(C_{TOT})$ is the maximum degraded ramp time of a net, which is a function of output load $C_{TOT}$, $T_{Rdr}$ is the output ramp time of the net driver, which is a function of output load $C_{TOT}$, α is a coefficient that is adjusted for a particular technology, $R_w$ and $C_w$ are the net wire resistance and capacitance, respectively, $C_i$ is the sink input capacitance of the $i^{th}$ driven cell on the net, q is the number of sinks (input pins) coupled to the net, β is a resistance and technology dependent coefficient for the net driver, and $C_{TOT}$ is the total interconnect capacitance on that net. The unit resistance and capacitance constants are provided with each technology library. In one embodiment, A=4 and B=1.35. $C_{TOT}$ is the sum of the wire capacitance $C_W$ of the net and the input capacitances $C_i$ of all input pins coupled to the net, as given by the parenthetical expression on the right-hand side of Equation 2.

After manipulating Equation 2 and testing it on numerous examples in 0.18 micron technology, the following formula can be derived, which estimates the maximum degraded ramp time of a net:

$$T_{Rdeg}(C_{TOT}) = \frac{r_0}{Ac_0}C_{TOT}^2 + BT_{Rdr}(C_{TOT}) \qquad \text{Eq. 3}$$

where $r_0$ and $c_0$ are the interconnect unit resistance and unit capacitance, respectively, A and B are coefficients, and $C_{TOT}$ is the total interconnect capacitance on that net. The unit resistance and capacitance constants are provided with each technology library. In one embodiment, A=4 and B=1.35. However, other values for coefficients A and B may be useful for other particular technologies.

The output ramp time $T_{Rdr}$ for the net driver is a driver-specific, piecewise linear function of $C_{TOT}$ that is provided with the technology library in "data" form. This data is typically provided as a table, which gives the output ramp time values for a variety of values of $C_{TOT}$.

The goal of the ramp time optimization process performed by the re-synthesis algorithm in step 113 is to ensure that the degraded ramp time and each input pin is smaller than the maximum allowable ramp time value that is specified for that particular technology. By setting the maximum degraded ramp time $T_{Rdeg}(C_{tot})$ given in Equation 3 equal to the maximum allowable ramp time specification, MAX_RAMP_TIME, the following equation can be solved during an initialization phase for each net driver D in the library:

$$\text{MAX\_RAMP\_TIME} = \frac{r_0}{4c_0}C_{TOT}^2 + 1.35T_{Rdr}(C_{TOT}) \qquad \text{Eq. 4}$$

Since the function on the right-hand side of Equation 4 is not analytical, Equation 4 is solved using a bisection method, for example. Let $C_{TOT}(D)$ denote the solution of Equation 4. The function $T_{Rdeg}(C_{TOT})$ is monotonically increasing. Thus, if a driver D drives a net with a capacitance smaller than $C_{TOT}(D)$, the degraded ramp time at all the input pins coupled to that net will be smaller than the maximum allowable ramp time value, MAX_RAMP_TIME. The goal of the ramp time optimization process can then be expressed in terms of a maximum capacitance in which the re-synthesis algorithm ensures that each net driven by driver D has a capacitance that is smaller than $C_{TOT}(D)$.

For each net driver in the netlist, the re-synthesis algorithm therefore generates a capacitance constraint $C_{TOT}(D)$ by solving Equation 4 for that net driver. As the re-synthesis algorithm optimizes the netlist, the algorithm ensures that all capacitance constraints are satisfied.

Once re-synthesis has completed and an optimized netlist 114 has been generated, the trial physical placement 109 is updated, at step 115, to place any new or modified cells into the physical placement pattern. The interconnections in the optimized netlist 114 are then routed at step 116. These interconnections are routed along predetermine routing layers.

A further delay calculation can be performed during step 116 using the new routing data, and routing can be performed in an iterative fashion until the delays sufficiently converge. The optimized netlist 114 can again be re-synthesized for further optimization at step 117. If there are any remaining timing violations following step 117, the logic designer and/or design tools can return to prior process steps to correct these timing violations.

Once the final re-synthesis is complete, the physical placement and routing data are again updated, at step 118, and a final layout definition is prepared, at step 119. This final layout definition includes a netlist of the selected cells and the interconnections between the cells, placement data for the cells, routing data for the interconnections between the cells and cell layout definitions. The cell layout definitions include layout patterns of the interconnected transistors, local cell routing data and geometry data for the interconnected transistors. The integrated circuit layout definition can then used to fabricate the integrated circuit.

FIG. 2 is a flow chart illustrating some of the steps performed by the re-synthesis algorithm in step 113 of FIG. 1. Re-synthesis algorithm 200 begins at step 201 at which the algorithm receives the current netlist, the current placement data and the technology data from the cell library. Based on these input parameters, re-synthesis algorithm 200 generates the capacitance constraints for each net driver type at step 202, according to Equations 3 and 4 above.

At step 203, a set of critical nodes is selected for optimization within a sub-netlist. The sub-netlist is then re-synthesized at step 204 by inserting buffer or buffer trees in critical paths, varying drive strengths or input capacitances of selected transistors, or restructuring certain portions of the logic. The re-synthesis algorithm used in step 204 is controlled to ensure that the total capacitance driven by each net driver is less than the capacitance constraint generated for that net driver at step 202. The resulting optimized netlist is then generated at step 205.

FIG. 3 illustrates an example of the optimization process used in step 204 of FIG. 2. In FIG. 3, circuit 300 represents a selected sub-netlist within a critical path. Circuit 300 includes a net driver logic element 301, which drives a plurality of net receiver logic elements 302–306 over a net 307. During the re-synthesis process, the re-synthesis algorithm reduces ramp time violations by ensuring that net driver 301 does not drive a total interconnect capacitance (i.e. the wire capacitance of net 307 plus the input capacitances of net receivers 302–306) that is greater than the capacitance constraint for that net driver type. The wire capacitance is based on an estimated wire length for net 307 using the placement data generated during placement of elements 301–306 in step 108 in FIG. 1. If the total capacitance driven by net driver 301 exceeds the capacitance constraint for net driver 301, then in the worst case a ramp time violation may occur at the input of one or more of the net receivers 302–306. The re-synthesis algorithm reduces ramp time violations by ensuring that the capacitance constraints are not violated. This can be done by replacing net driver 301 with a net driver having a larger drive strength and thus a larger capacitance constraint. Alternatively, the load capacitance can be reduced by replacing one or more of the net receivers with net receivers having lower input capacitances. Also, one or more buffers 308 (shown in phantom) can be inserted into net 307 to provide greater drive strength, divide the loads 302–306 and reduce the length of net 307. Other variations can also be made. For example, the capacitance constraints can be fed back to the placement algorithm at step 108 in FIG. 1 to constrain the placement of cells 301–306 and thus the estimated wire capacitance of net 307.

The ramp time optimization process described above was tested on numerous design examples, ranging in size from 50,000 gates to 500,000 gates, in 0.18 micron technology. The initial number of ramp time violations for these designs was between a few hundred and several thousand. The highest number of ramp time violations was 8,749. The above-described ramp time optimization process was able to completely eliminate ramp time violations in 60% of the designs. In the remaining 40% of the designs, the number of ramp time violations was reduced to just a few violations that could be easily removed manually.

Although the present invention has been described with reference to preferred embodiments, workers skilled in the art will recognize that changes may be made in form and detail without departing from the spirit and scope of the invention. For example, any re-synthesis algorithm can be used with the present invention. The algorithm would simply be modified to take into account the capacitance constraints for each net driver. Also, The present invention can be used in a variety of layout processes. The processes shown in FIGS. 1 and 2 are provided as examples only, and numerous modifications can be made.

What is claimed is:

1. A method of generating constraints for an integrated circuit logic re-synthesis algorithm, the method comprising:

(a) receiving a netlist of interconnected logic elements, which includes a plurality of nets, wherein each of the nets is coupled between a respective net driver logic element and at least one driven logic element;

(b) receiving a maximum allowable input ramp time specification for the interconnected logic elements and an output ramp time specification for the net driver logic elements; and (c) generating a maximum interconnect capacitance constraint for each of the net driver logic elements based on the output ramp time specification for the respective net driver logic element and the maximum allowable input ramp time specification.

2. The method of claim 1 and further comprising:

(d) providing the maximum interconnect capacitance constraints to a logic re-synthesis algorithm prior to routing the plurality of nets.

3. The method of claim 2 and further comprising:

(e) modifying a portion of the netlist while ensuring that each net driver in the portion drives a net that has a total capacitance of less than or equal to the maximum interconnect capacitance constraint.

4. The method of claim 1 wherein step (c) is performed after the logic elements in the netlist have been placed in a physical placement pattern and before the plurality of nets have been routed within the physical placement pattern.

5. The method of claim 1 wherein the maximum interconnect capacitance constraint generated for each of the net driver logic elements is an estimate of a total interconnect capacitance for the respective net that would result in the respective net having a degraded input ramp time, at the driven logic element, which is substantially equal to the maximum allowable input ramp time specification.

6. The method of claim 1 wherein:

step (b) comprises receiving a database of output ramp time values as a function of interconnect capacitance for each different type of the net driver logic elements; and step (c) comprises, for each of the net driver logic elements:

(c)(1) estimating a total interconnect capacitance for the respective net that would result in the respective net having a degraded input ramp time, at the driven logic element, which is substantially equal to the maximum allowable input ramp time specification, wherein the total interconnect capacitance is estimated as a function of the output ramp time values for the respective net driver logic element and the maximum allowable input ramp time specification; and (c)(2) setting the maximum interconnect capacitance constraint for that net driver logic element equal to the estimated total interconnect capacitance.

7. The method of claim 1 wherein step (c) comprises, for each of the net driver logic elements:

(c)(1) solving the following relation for a value of the variable, $C_{TOT}$:

$$\text{MAX\_RAMP\_TIME} = \frac{r_0}{Ac_0} \cdot C_{TOT}^2 + B \cdot T_{Rdr}(C_{TOT})$$

where $C_{TOT}$ is the total interconnect capacitance of the respective net, MAX_RAMP_TIME is the maximum allowable input ramp time specification, $r_0$ is a unit interconnect resistance constant, $c_0$ is a unit interconnect capacitance constant, A and B are coefficients, and $T_{Rdr}(C_{TOT})$ is the output ramp time specification for the respective net driver logic element, which is a function of $C_{TOT}$; and (c)(2) setting the maximum interconnect capacitance constraint for that net driver logic element equal to the value of $C_{TOT}$.

8. A computer-readable medium comprising instructions readable by a computer-aided design tool for optimizing a functional block within a netlist of an integrated circuit, which when executed, cause the tool to perform steps comprising:

(a) inputting the netlist, wherein the netlist comprises interconnected logic elements, including a plurality of nets, wherein each of the nets is coupled between a respective net driver logic element and at least one driven logic element;

(b) inputting a maximum allowable input ramp time specification for the interconnected logic elements and an output ramp time specification for the net driver logic elements; and (c) generating a maximum interconnect capacitance constraint for each of the net driver logic elements based on the output ramp time specification for the respective net driver logic element and the maximum allowable input ramp time specification.

9. The computer-readable medium of claim 8 wherein the instructions further cause the tool to perform steps of:

(d) providing the maximum interconnect capacitance constraints to a logic re-synthesis algorithm, prior to routing the plurality of nets.

10. The computer-readable medium of claim 9 wherein the instructions further cause the tool to perform steps of:

(e) modifying a portion of the netlist while ensuring that each net driver in the portion drives a net that has a total capacitance of less than or equal to the maximum interconnect capacitance constraint for that net driver.

11. The computer-readable medium of claim 8 wherein step (c) is performed after the logic elements in the netlist have been placed in a physical placement pattern and before the plurality of nets have been routed within the physical placement pattern.

12. The computer-readable medium of claim 8 wherein the maximum interconnect capacitance constraint generated for each of the net driver logic elements is an estimate of a total interconnect capacitance for the respective net that would result in the respective net having a degraded input ramp time, at the driven logic element, which is substantially equal to the maximum allowable input ramp time specification.

13. The computer-readable medium of claim 8 wherein:
step (b) comprises receiving output ramp time values as a function of interconnect capacitance for each net driver logic element; and
step (c) comprises, for each of the net driver logic elements:
(c)(1) estimating a total interconnect capacitance for the respective net that would result in the respective net having a degraded input ramp time, at the driven logic element, which is substantially equal to the maximum allowable input ramp time specification, wherein the total interconnect capacitance is estimated as a function of the output ramp time values for the respective net driver logic element and the maximum allowable input ramp time specification; and
(c)(2) setting the maximum interconnect capacitance constraint for that net driver logic element equal to the estimated total interconnect capacitance.

14. The computer-readable medium of claim 8 wherein step (c) comprises, for each of the net driver logic elements:
(c)(1) solving the following relation for a value of the variable, $C_{TOT}$:

$$\text{MAX\_RAMP\_TIME} = \frac{r_0}{Ac_0} \cdot C_{TOT}^2 + B \cdot T_{Rdr}(C_{TOT})$$

where $C_{TOT}$ is the total interconnect capacitance of the respective net, MAX_RAMP_TIME is the maximum allowable input ramp time specification, $r_0$ is a unit interconnect resistance constant, $c_0$ is a unit interconnect capacitance constant, A and B are coefficients, and $T_{Rdr}(C_{TOT})$ is the output ramp time specification for the respective net driver logic element, which is a function of $C_{TOT}$; and
(c)(2) setting the maximum interconnect capacitance constraint for that net driver logic element equal to the value of $C_{TOT}$.

15. A computer-aided design tool for optimizing a functional block within a netlist of an integrated circuit, wherein the tool comprises:
(a) means for receiving the netlist, wherein the netlist comprises interconnected logic elements, including a plurality of nets, wherein each of the nets is coupled between a respective net driver logic element and at least one driven logic element;
(b) means for receiving a maximum allowable input ramp time specification for the interconnected logic elements and an output ramp time specification for the net driver logic elements; and
(c) means for generating a maximum interconnect capacitance constraint for each of the net driver logic elements based on the output ramp time specification for the respective net driver logic element and the maximum allowable input ramp time specification.

16. The computer-aided design tool of claim 15 and further comprising:
(e) means for modifying a portion of the netlist while ensuring that each net driver in the portion drives a net that has a total capacitance of less than or equal to the maximum interconnect capacitance constraint for that net driver.

17. The computer-aided design tool of claim 15 wherein the means for generating generates the maximum interconnect capacitance constraints for the net driver logic elements with placement data representing placement of the logic elements in a physical placement pattern and without routing data representing physical routes of the plurality of nets within the physical placement pattern.

18. The computer-aided design tool of claim 15 wherein the maximum interconnect capacitance constraint generated for each of the net driver logic elements is an estimate of a total interconnect capacitance for the respective net that would result in the respective net having a degraded input ramp time, at the driven logic element, which is substantially equal to the maximum allowable input ramp time specification.

19. The computer-aided design tool of claim 15 wherein:
the means for receiving an output ramp time specification comprises means for receiving output ramp time values as a function of interconnect capacitance for each net driver logic element; and
the means for generating comprises, for each of the net driver logic elements:
(c)(1) means for estimating a total interconnect capacitance for the respective net that would result in the respective net having a degraded input ramp time, at the driven logic element, which is substantially equal to the maximum allowable input ramp time specification, wherein the total interconnect capacitance is estimated as a function of the output ramp time values for the respective net driver logic element and the maximum allowable input ramp time specification; and
(c)(2) means for setting the maximum interconnect capacitance constraint for that net driver logic element equal to the estimated total interconnect capacitance.

20. The computer-aided design tool of claim 15 wherein the means for generating comprises:
(c)(1) means for solving the following relation for a value of the variable, $C_{TOT}$:

$$\text{MAX\_RAMP\_TIME} = \frac{r_0}{Ac_0} \cdot C_{TOT}^2 + B \cdot T_{Rdr}(C_{TOT})$$

where $C_{TOT}$ is the total interconnect capacitance of the respective net, MAX_RAMP_TIME is the maximum allowable input ramp time specification, $r_0$ is a unit interconnect resistance constant, $c_0$ is a unit interconnect capacitance constant, A and B are coefficients, and $T_{Rdr}(C_{TOT})$ is the output ramp time specification for the respective net driver logic element, which is a function of $C_{TOT}$; and
(c)(2) means for setting the maximum interconnect capacitance constraint for that net driver logic element equal to the value of $C_{TOT}$.

* * * * *